United States Patent
Kobayashi et al.

(10) Patent No.: US 12,283,926 B2
(45) Date of Patent: Apr. 22, 2025

(54) COMPARATOR, PHOTOELECTRIC CONVERSION DEVICE, AND APPARATUS

(71) Applicant: CANON KABUSHIKI KAISHA, Tokyo (JP)

(72) Inventors: Hideo Kobayashi, Tokyo (JP); So Hasegawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 559 days.

(21) Appl. No.: 17/684,221

(22) Filed: Mar. 1, 2022

(65) Prior Publication Data

US 2022/0286100 A1   Sep. 8, 2022

(30) Foreign Application Priority Data

Mar. 3, 2021   (JP) .................... 2021-033250

(51) Int. Cl.
H03F 3/45   (2006.01)
H03F 1/32   (2006.01)
H04N 25/75   (2023.01)

(52) U.S. Cl.
CPC ....... *H03F 3/45188* (2013.01); *H03F 1/3211* (2013.01); *H04N 25/75* (2023.01)

(58) Field of Classification Search
CPC .... H03F 3/45188; H03F 1/3211; H04N 25/75
USPC ....................................................... 330/253
See application file for complete search history.

(56) References Cited

U.S. PATENT DOCUMENTS

| | | | |
|---|---|---|---|
| 8,384,055 B2 | 2/2013 | Shimizu et al. | |
| 8,767,106 B2 | 7/2014 | Ueno | |
| 11,729,533 B2* | 8/2023 | Moue | H04N 25/57 348/294 |
| 2011/0101256 A1 | 5/2011 | Shimizu et al. | |
| 2013/0100326 A1 | 4/2013 | Ueno | |
| 2016/0269039 A1* | 9/2016 | Yoo | H03K 5/2481 |

FOREIGN PATENT DOCUMENTS

| | | | |
|---|---|---|---|
| JP | 2008306504 A | 12/2008 |
| JP | 2009048355 A | 3/2009 |
| JP | 2011097406 A | 5/2011 |
| JP | 2013090305 A | 5/2013 |
| JP | 2013149687 A | 8/2013 |
| JP | 2017184122 A | 10/2017 |

\* cited by examiner

*Primary Examiner* — Hafizur Rahman
(74) *Attorney, Agent, or Firm* — Canon U.S.A., Inc. IP Division

(57) ABSTRACT

A comparator according to an embodiment of the present disclosure includes a first differential transistor and a second differential transistor forming a differential pair, a first load transistor and a second load transistor respectively provided corresponding to the first differential transistor and the second differential transistor, and a first cascode transistor connected in cascode between the first differential transistor and the first load transistor.

21 Claims, 10 Drawing Sheets

COMPARATOR, PHOTOELECTRIC CONVERSION DEVICE, AND APPARATUS

BACKGROUND

Field

The present disclosure relates to a comparator, a photoelectric conversion device, and an apparatus.

Description of the Related Art

Comparators including differential amplifier circuits are used in various devices. A comparator described in Japanese Patent Laid-Open No. 2013-90305 includes a pair of differential transistors, a pair of load transistors, and one or a pair of cascode transistors connected in cascode to the differential transistors. The cascode transistor may function as an isolator to reduce noise.

However, when the cascode transistor is in a linear operation state, the potential variation of the main node of the differential transistor increases, and the kickback to the input of the comparator increases.

SUMMARY

An aspect of the present disclosure is to reduce kickback to an input of a comparator.

According to an embodiment of the present disclosure, there is provided a comparator including a first differential transistor and a second differential transistor forming a differential pair, a first load transistor and a second load transistor respectively provided to the first differential transistor and the second differential transistor, a first cascode transistor connected in cascode between the first differential transistor and the first load transistor, and an amplitude limiting element configured to limit an amplitude of an output signal at an output node between the first load transistor and the first cascode transistor.

Further features of the present disclosure will become apparent from the following description of exemplary embodiments with reference to the attached drawings.

DESCRIPTION OF THE EMBODIMENTS

Figure 1:
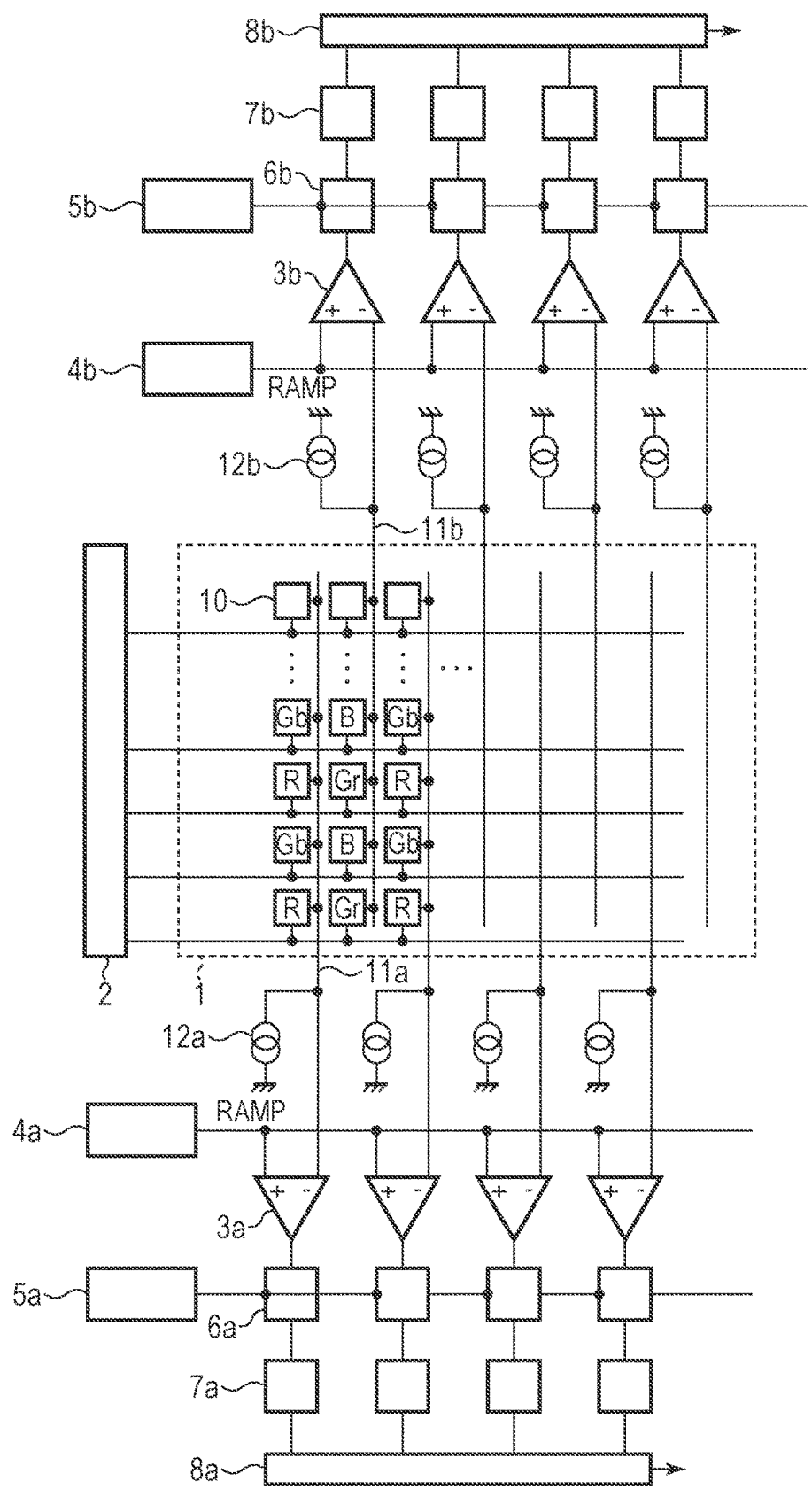
FIG. 1 is a block diagram of an imaging apparatus according to a first embodiment.

Hereinafter, embodiments of the present disclosure will be described with reference to the drawings. The following embodiments are intended to embody the technical idea of the present disclosure and do not limit the present disclosure. The sizes and positional relationships of the members shown in the drawings may be exaggerated for clarity of description. In the following description, the same components are denoted by the same reference numerals, and description thereof may be omitted.

First Embodiment

FIG. 1 is a block diagram of an imaging device according to the present embodiment. The imaging device is a CMOS (Complementary Metal Oxide Semiconductor) image sensor, for example, and comprises a pixel unit 1, a vertical scanning circuit 2, comparison units 3a, 3b, reference signal generation circuits 4a, 4b, counters 5a, 5b, first memories 6a, 6b, second memories 7a, 7b, output circuits 8a, 8b, signal lines 11a, 11b, and current sources 12a, 12b.

The pixel unit 1 includes a plurality of pixels 10 arranged in a two-dimensional array, and each pixel 10 includes a photoelectric conversion unit that generates and accumulates signal charges corresponding to the amount of received light. In this specification, a row direction indicates a horizontal direction in the drawing, and a column direction indicates a vertical direction in the drawing. Microlenses and color filters may be arranged on the pixels 10. The color filter is, for example, a primary color filter of red (R), blue (B), and green (Gr, Gb), and is provided in each pixel 10 in a Bayer array. Some pixels 10 are shielded from light as OB pixels (optical black pixels). The plurality of pixels 10 may be provided with a ranging row in which focus detection pixels for outputting focus detection pixel signals are arranged, and a plurality of imaging rows in which imaging pixels for outputting pixel signals for generating images are arranged. The signal lines 11a and 11b are provided for each column of the pixels 10, and the pixels 10 in the same column output pixel signals to the common signal lines 11a and 11b. In this embodiment, the signal lines 11a of the odd-numbered columns and the signal lines 11b of the even-numbered columns may be connected to different circuits. That is, the pixels 10 of the odd-numbered columns are read out by the comparator 3a, the reference signal generation circuit 4a, the counter 5a, the first memory 6a, the second memory 7a, and the output circuit 8a via the signal line 11a. The pixels 10 of the even-numbered columns are read out by the comparator 3b, the reference signal generation circuit 4b, the counter 5b, the first memory 6b, the second memory 7b, and the output circuit 8b via the signal line 11b. Note that the number of signal lines arranged in one column of pixels 10 is not limited to one, and may be a plurality such as 2 to 24.

The vertical scanning circuit 2 includes a shift register, a gate circuit, a buffer circuit, and the like, and outputs a control signal to the pixels 10 based on a vertical synchronization signal, a horizontal synchronization signal, a clock signal, and the like, and drives the pixels 10 for each row. The current sources 12a and 12b are connected to the signal lines 11a and 11b and function as load circuits for the pixels 10.

The comparators 3a and 3b are configured to include a differential amplifier circuit or the like, and a pixel signal can be input to an inverting input node, and a reference signal RAMP can be input to a non-inverting input node. The comparators 3a and 3b compare the reference signal RAMP with the pixel signal, and output a comparison signal representing the comparison result from the output node.

The reference signal generation circuits 4a and 4b generate reference signals (ramp signals) RAMP whose voltages change depending on time. The reference signal generating circuits 4a and 4b may be various types such as a capacitance charging/discharging type, a DAC type, and a current steering type. The reference signal RAMP may be not only an up slope in which the voltage increases with time but also a down slope in which the voltage decreases with time. The reference signal RAMP may include a plurality of slope waveforms having different voltage change rates per unit time.

The counters 5a and 5b count up or count down the counters in synchronization with the reference signal RAMP. The counters 5a and 5b start counting the clock pulses simultaneously with the start of the voltage change of the reference signal RAMP of the reference signal generation circuits 4a and 4b, and output count signals. The count signal is supplied to the first memories 6a and 6b. A counter may be provided for each column of the signal lines 11a and 11b, and a common clock pulse may be supplied to each counter.

The first memories 6a and 6b receive the comparison results from the comparators 3a and 3b and the count values from the counters 5a and 5b, and latch the count values at the timing when the comparison results are inverted. The count values held in the first memories 6a and 6b represent values obtained by analog-to-digital conversion of pixel signals. The second memories 7a and 7b can further hold count values transferred from the first memories 6a and 6b. The first memories 6a and 6b and the second memories 7a and 7b may hold count values at the time of resetting the pixel 10 and count values based on photoelectric conversion of the pixel 10. The output circuits 8a and 8b may include a horizontal scanning circuit and a signal processing circuit. The horizontal scanning circuit includes a decoder and a shift register, sequentially reads count values held in the first memories 6a and 6b and the second memories 7a and 7b, and outputs the count values to the signal processing circuit. The signal processing circuit includes a digital signal processor and performs digital signal processing such as digital gain, digital correlation double sampling, digital offset, and linearity correction. The signal processing circuit includes a serial output circuit of the LVDS (Low Voltage Differential Signaling) system, and outputs the digital signal subjected to the signal processing to the outside of the image pickup device at high speed and low power consumption.

Figure 2:
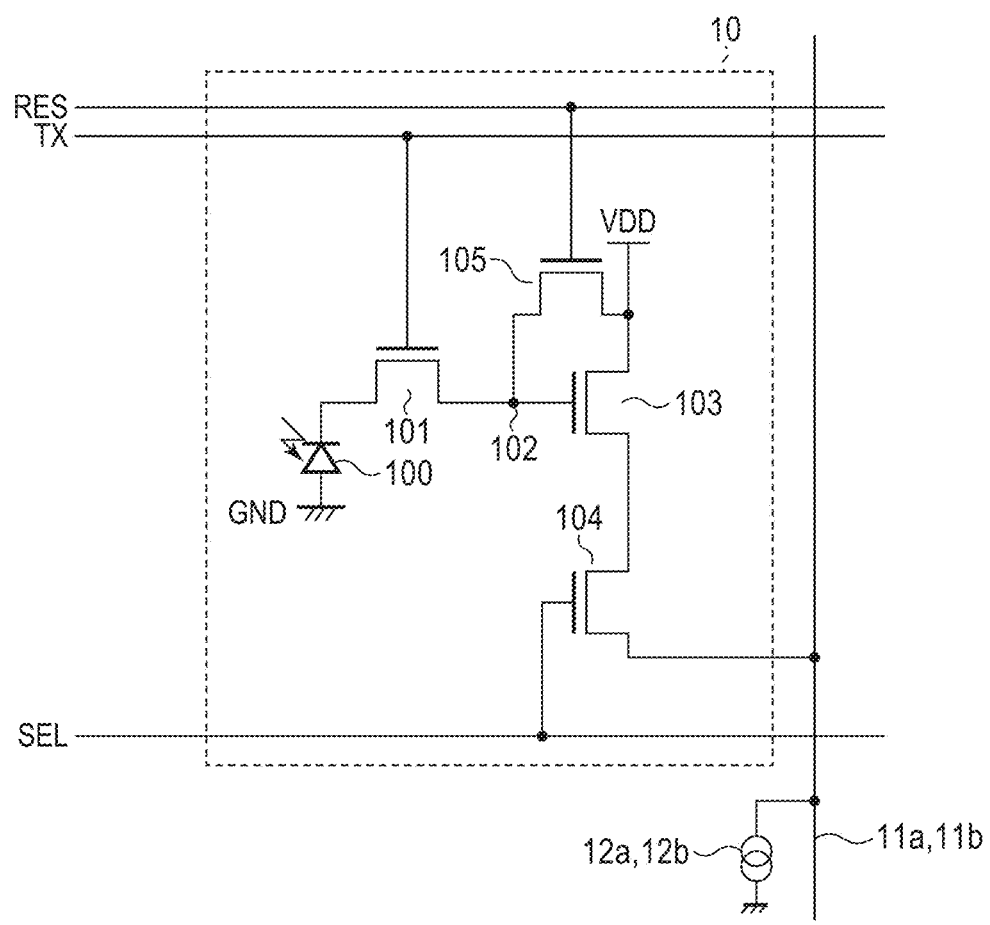
FIG. 2 is an equivalent circuit diagram of a pixel in the first embodiment.

FIG. 2 is an equivalent circuit diagram of the pixel 10 in the present embodiment. The pixel 10 includes a photoelectric conversion unit 100, a transfer transistor 101, a floating diffusion region 102, an amplifier transistor 103, a select transistor 104, and a reset transistor 105. In the following description, the transistors constituting the pixel 10 are N-channel MOS transistors. The photoelectric conversion unit 100 includes, for example, a photodiode, and performs photoelectric conversion by incident light and accumulation of electric charges. The photoelectric conversion unit 100 is not limited to a photodiode, and may be made of any material that generates a photoelectric effect. The number of photoelectric conversion units 100 per pixel 10 is not limited, and two, four, or more photoelectric conversion units 100 may be provided so as to share one microlens. Further, dark current noise can be reduced by configuring the buried photodiode. The photoelectric conversion unit 100 is provided with a microlens, and light condensed by the microlens enters the photoelectric conversion unit 100.

The transfer transistor 101 is provided corresponding to the photoelectric conversion unit 100, and a control signal TX is applied to the gate thereof from the vertical scanning circuit 2. When the control signal TX becomes high level, the transfer transistor 101 is turned on (conductive state), and the signal charge accumulated in the photoelectric conversion unit 100 is transferred to the floating diffusion region 102 formed in the gate of the amplifier transistor 103. When the control signal TX becomes low level, the transfer transistor 101 is turned off (non-conductive state). The floating diffusion region 102 converts the signal charge into a voltage, and the amplifier transistor 103 outputs a signal voltage corresponding to the gate voltage from the source to the signal lines 11a and 11b via the select transistor 104. The drain of the amplifier transistor 103 is connected to the power supply VDD.

The reset transistor 105 has a source connected to the floating diffusion region 102, a drain connected to the power supply VDD, and a gate to which a control signal RES is applied from the vertical scanning circuit 2. When the control signal RES becomes high level, the reset transistor 105 is turned on, and the voltage of the power supply VDD is supplied to the floating diffusion region 102. The select transistor 104 is provided between the amplifier transistor 103 and the signal lines 11a and 11b, and a control signal SEL is applied to the gate of the select transistor 104 from the vertical scanning circuit 2. When the control signal SEL becomes high level, the amplifier transistor 103 and the signal lines 11a and 11b are electrically connected. Current sources 12a and 12b are connected to the signal lines 11a and 11b, and the current sources 12a and 12b supply a constant bias current to the source of the amplifier transistor 103 via the signal lines 11a and 11b.

The pixel 10 is not limited to the configuration shown in FIG. 2, and a plurality of select transistors may be provided in each pixel 10. Further, an additional capacitance may be arranged in the floating diffusion region, and the capacitance of the floating diffusion region may be selectable.

Figure 3:
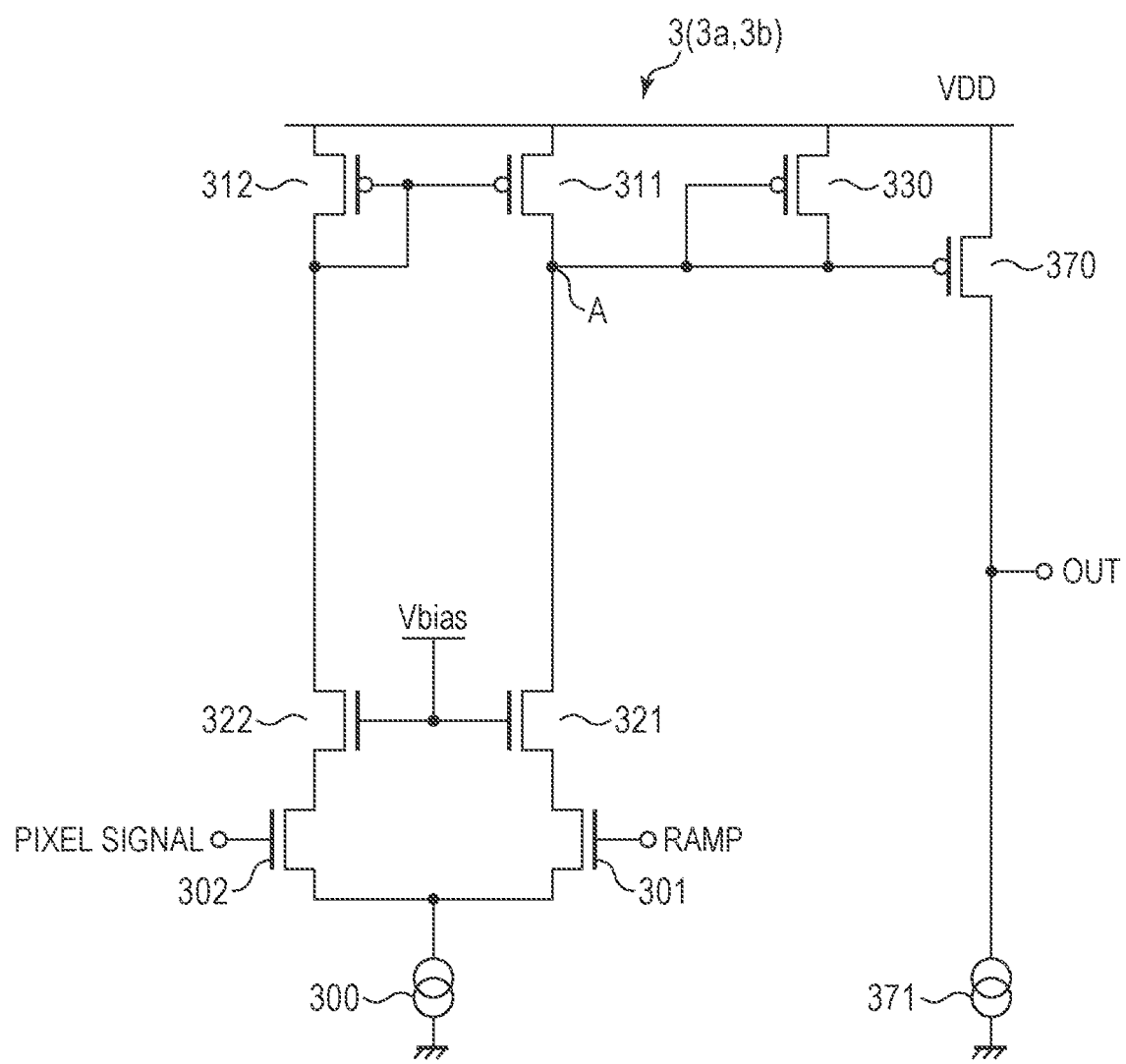
FIG. 3 is an equivalent circuit diagram of a comparator according to the first embodiment.

FIG. 3 is a block diagram of a comparator in the present embodiment. The comparator 3 (3a, 3b) includes a current source 300, a first differential transistor 301 of N channel MOS, a second differential transistor 302 of N channel MOS, a first load transistor 311 of P channel MOS, a second load transistor 312 of P channel MOS, a first cascode transistor 321 of N channel MOS, a second cascode transistor 322 of N channel MOS, an amplitude limiting transistor 330 of P channel MOS, a source follower transistor 370 of P channel MOS, and a current source 371.

The differential transistors 301 and 302 constitute a differential pair. A reference signal RAMP is input to the gate of the differential transistor 301, and a pixel signal is input to the gate of the differential transistor 302. Sources of the differential transistors 301 and 302 are connected to a ground line GND via a current source 300.

The load transistors 311 and 312 are paired and are provided corresponding to the differential transistors 301 and 302. The load transistors 311 and 312 constitute a current mirror circuit, and the gates of the load transistors 311 and 312 are connected to each other and connected to the drain of the load transistor 312. Sources of the load transistors 311 and 312 are connected to the power supply VDD.

The cascode transistors 321 and 322 are paired and are arranged between the differential transistors 301 and 302 and the load transistors 311 and 312, respectively. That is, the source of the cascode transistor 321 is connected to the drain of the differential transistor 301, and the drain of the cascode transistor 321 is connected to the drain of the load transistor 311. Similarly, the source of the cascode transistor 322 is connected to the drain of the differential transistor 302, and the drain of the cascode transistor 322 is connected to the drain of the load transistor 312. A predetermined bias voltage Vbias is applied to the gates of the cascode transistors 321 and 322.

The amplitude limiting transistor 330 is provided at the output of the differential stage, that is, at the output node A between the load transistor 311 and the cascode transistor 321. The gate and the drain of the amplitude limiting transistor 330 are connected to the drain of the load transistor 311, and the source of the amplitude limiting transistor 330 is connected to the power supply VDD. The amplitude limiting transistor 330 limits the amplitude at the output node A, thereby preventing the cascode transistor 321 from being in a linear operation state. Thus, variation in the potential of the drain of the differential transistor 301 is suppressed, and kickback to the input of the comparator 3 can be reduced.

The source follower transistor 370 is provided at the output node A of the differential stage. A gate of the source follower transistor 370 is connected to the output node A, and a source of the source follower transistor 370 is connected to the power supply VDD. The drain of the source follower transistor 370 is connected to the ground line GND via the current source 371, and can output the signal OUT.

Figure 4:
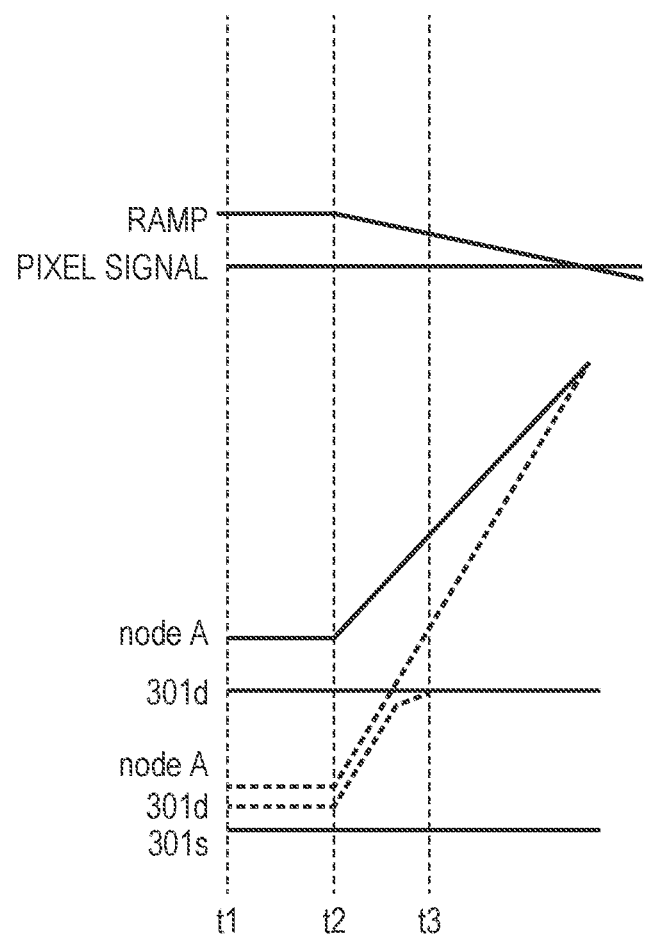
FIG. 4 is a timing chart illustrating an operation of the comparator in the first embodiment.

FIG. 4 is a timing chart illustrates an operation of the comparator in the present embodiment, and illustrates the potential changes of the reference signal RAMP, the pixel signal, the output node A, and the drain 301d and the source 301s of the differential transistor 301. The graph of solid line represents the operation of the present embodiment, and the graph of the broken line represents the operation of the comparative example in which the amplitude limiting transistor 330 is not provided.

First, the operation of the comparative example will be described. At the times t1 to t2, the potential of the reference signal RAMP is higher than the potential of the pixel signal, and current flows through the differential transistor 301. The potential of the drain 301d of the differential transistor 301 and the potential of the output node A of the differential stage drop to close to the potential of the source 301s.

At the time t2, the potential of the reference signal RAMP starts to decrease, and the current in the differential transistor 301 also starts to decrease. At the times t2 to t3, the cascode transistor 321 is in a linear operation, and the potential of the drain 301d of the differential transistor 301 rises together with the potential of the output node A of the differential stage. Here, the differential transistor 301 has a parasitic capacitance between the gate and the drain. Therefore, the potential fluctuation of the drain 301d causes the potential fluctuation of the gate via the parasitic capacitance, and interferes with the reference signal RAMP, and kickback to the input of the comparator 3 may increase.

After the time t3, when the potential difference between the output node A of the differential stage and the drain 301d, that is, the drain-source voltage Vds of the cascode transistor 321 becomes sufficiently large to saturate the cascode transistor 321, the potential of the drain 301d becomes substantially constant. That is, even if the potential of the output node A of the differential stage changes, the potential of the drain 301d does not change.

Next, the operation of the present embodiment will be described. At the times t1 to t2, a current flows through the differential transistor 301, and the potential of the output node A of the differential stage decreases. Since the amplitude limiting transistor 330 is provided in the output node A, the reduction in the potential of the output node A is suppressed by the amplitude limiting transistor 330. At this time, the potential of the output node A can be determined by the gate-source voltage Vgs of the amplitude limiting transistor 330. In this embodiment, the potential of the output node A and the potential of the drain 301d are higher than those in the comparative example. The voltage between the drain and source of the cascode transistor 321 is sufficiently high that the cascode transistor 321 operates in a saturation state. At this condition, in the cascode transistor 321, the drain-source voltage Vds, the gate-source voltage Vgs, and the threshold voltage Vth may satisfy the following formula (1).

$$Vds > Vgs - Vth \qquad (1)$$

At the times t2 to t3, while the potential of the output node A rises with the decrease in the potential of the reference signal RAMP, the cascode transistor 321 maintains a saturation operation state (formula (1)), and the potential of the drain 301d of the differential transistor 301 is constant. Therefore, even if a parasitic capacitance exists between the gate and the drain of the differential transistor 301, the potential variation of the gate is reduced, and interference with the reference signal RAMP can be suppressed. Even after the time t3, the cascode transistor 321 maintains a saturation operation state, and the potential of the drain 301d is constant. It is desirable that the above-described formula (1) is satisfied from the minimum value to the maximum value of the output signal at the output node A.

In the present embodiment, by providing the amplitude limiting transistor 330, it is possible to prevent the cascode transistor 321 from being in a linear operation state, and to reduce kickback to the input node of the comparator 3. In particular, when the load transistors 311 and 312 of the current mirror are provided, the lower limit of the output node A of the differential stage falls to close to the potential of the sources of the differential transistors 301 and 302, there is a possibility that the cascode transistor 321 is in a linear operation. Even in such a case, the amplitude limiting transistor 330 in this embodiment can effectively suppress the linear operation of the cascode transistor 321 and reduce kickback to the input of the comparator 3.

Although the amplitude limiting transistor 330 is described as an example of the amplitude limiting element in the present embodiment, the amplitude limiting element may be a diode element, a clip circuit, or the like.

Second Embodiment

Next, a comparator and an imaging device according to the second embodiment will be described focusing on configurations different from those of the first embodiment.

Figure 5:
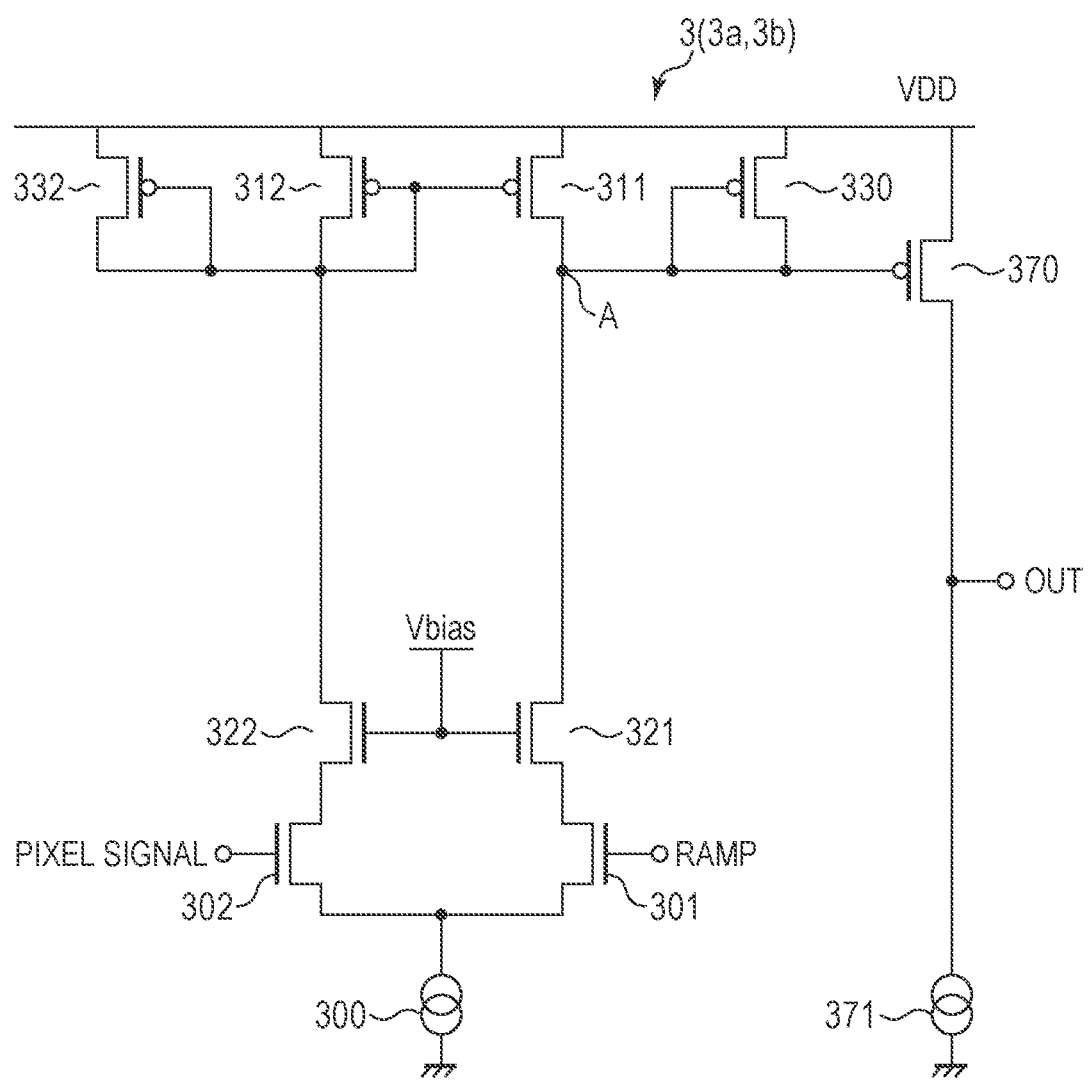
FIG. 5 is an equivalent circuit diagram of a comparator according to a second embodiment.

FIG. 5 is a block diagram of a comparator according to the present embodiment. In this embodiment, a transistor 332 is provided in addition to the amplitude limiting transistor 330. The transistor 332 is a P-channel MOS and is paired with the amplitude limiting transistor 330. The gate and the drain of the transistor 332 are connected to the drain and the gate of the load transistor 312, and the source of the transistor 332 is connected to the power supply VDD.

In the first embodiment, when the power supply voltage varies due to disturbance, the amplitude limiting transistor 330 may vary the voltage of the output node A of the differential stage. In the present embodiment, the transistor 332 generates a potential variation also in the gates of the load transistors 311 and 312, and can cancel the influence of the power supply voltage variation at the output node A.

Also in the present embodiment, the amplitude limiting transistor 330 can effectively suppress the linear operation of the cascode transistor 321 and reduce kickback to the input of the comparator 3.

Third Embodiment

Next, a comparator and an imaging device according to a third embodiment will be described. The configuration of the comparator in this embodiment is the same as that in the second embodiment, but a desirable constant value of the circuit will be described in this embodiment.

As described above, saturation of the cascode transistor 321 may reduce kickback to the input of the comparator 3. In order to cause the cascode transistor 321 to operate in a saturation state, it is desirable that the above formula (1) is satisfied. The formula (1) can be expressed as the following formula (2).

$$Vds > Vgs - Vth = \sqrt{\frac{2LI}{\mu C_{ox} W}} \quad (2)$$

In the formula (2), "L" is gate length, "I" is drain current, "μ" is mobility, "Cox" is gate oxide film capacitance per unit area, and "W" is gate width. Here, by shortening the gate length L, the drain-source voltage Vds required for saturation operation of the cascode transistor 321 can be suppressed. For example, when the gate length L of the cascode transistor 321 is shorter than the gate length L of the differential transistor 301, the drain-source voltage Vds of the cascode transistor 321 can be suppressed. The differential transistor 302 and the cascode transistor 322 may be configured in the same manner as the differential transistor 301 and the cascode transistor 321.

Figure 6:
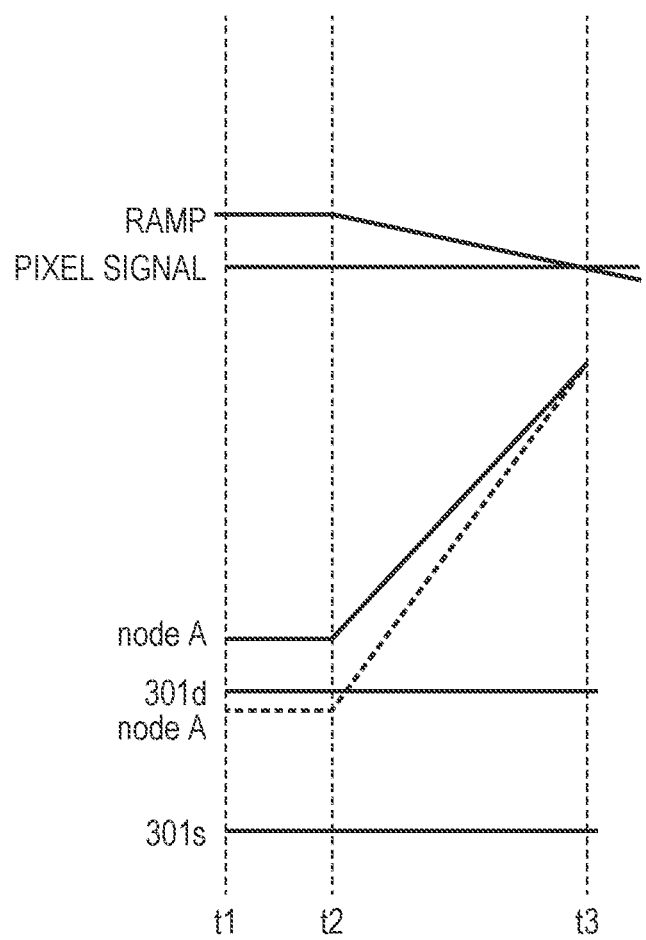
FIG. 6 is a timing chart illustrating an operation of the comparator in the third embodiment.

FIG. 6 is a timing chart illustrating the operation of the comparator in the present embodiment, and shows the potential changes of the reference signal RAMP, the pixel signal, the output node A, and the drain 301d and the source 301s of the differential transistor 301. The solid line graph represents the operation of the present embodiment, and the graph of the broken line represents the operation of the comparative example in which the cascode transistor 321 is not provided.

First, the operation of the comparative example will be described. At the times t1 to t2, the potential of the output node A of the differential stage decreases. Here, when the cascode transistors 321 and 322 are not provided, it is not necessary to ensure the drain-source voltage Vds of the cascode transistors 321 and 322. Therefore, the potential of the output node A can be lowered without limiting the amplitude of the output node A of the differential stage by the amplitude limiting transistor 330. From the time t2 to time t3, it can be confirmed that the potential of the output node A of the differential stage rises from a sufficiently low potential, and the rate of change of the potential, that is, the slew rate (gradient) increases.

On the other hand, in the case where the cascode transistors 321 and 322 are provided, at the times t1 to t2, the potential drop of the output node A of the differential stage is suppressed by the amplitude limiting transistor 330, and the drain-source voltage Vds of the cascode transistor 321 is in a saturation operation state. In the present embodiment, the gate length L of the cascode transistor 321 is shorter than the gate length L of the differential transistor 301. Therefore, the drain-source voltage Vds for saturation operation of the cascode transistor 321 can be reduced, and the potential of the output node A of the differential stage can be lowered. At the times t2 to t3, the slew rate of the potential of the output node A is sufficiently increased, and high-speed operation can be realized. Therefore, according to the present embodiment, it is possible to increase the slew rate of the output signal while avoiding the linear operation of the cascode transistor 321.

Although an example in which the gate length L of the cascode transistor 321 is shorter than the gate length L of the differential transistor 301 has been described in the present embodiment, constants or values other than the gate length L may be changed appropriately in the formula (2). For example, the drain-source voltage Vds may be set small while the cascode transistor 321 is in a saturation operation state by increasing the gate width W.

Fourth Embodiment

Next, a comparator and an imaging device according to the fourth embodiment will be described focusing on configurations different from those of the second embodiment.

Figure 7:
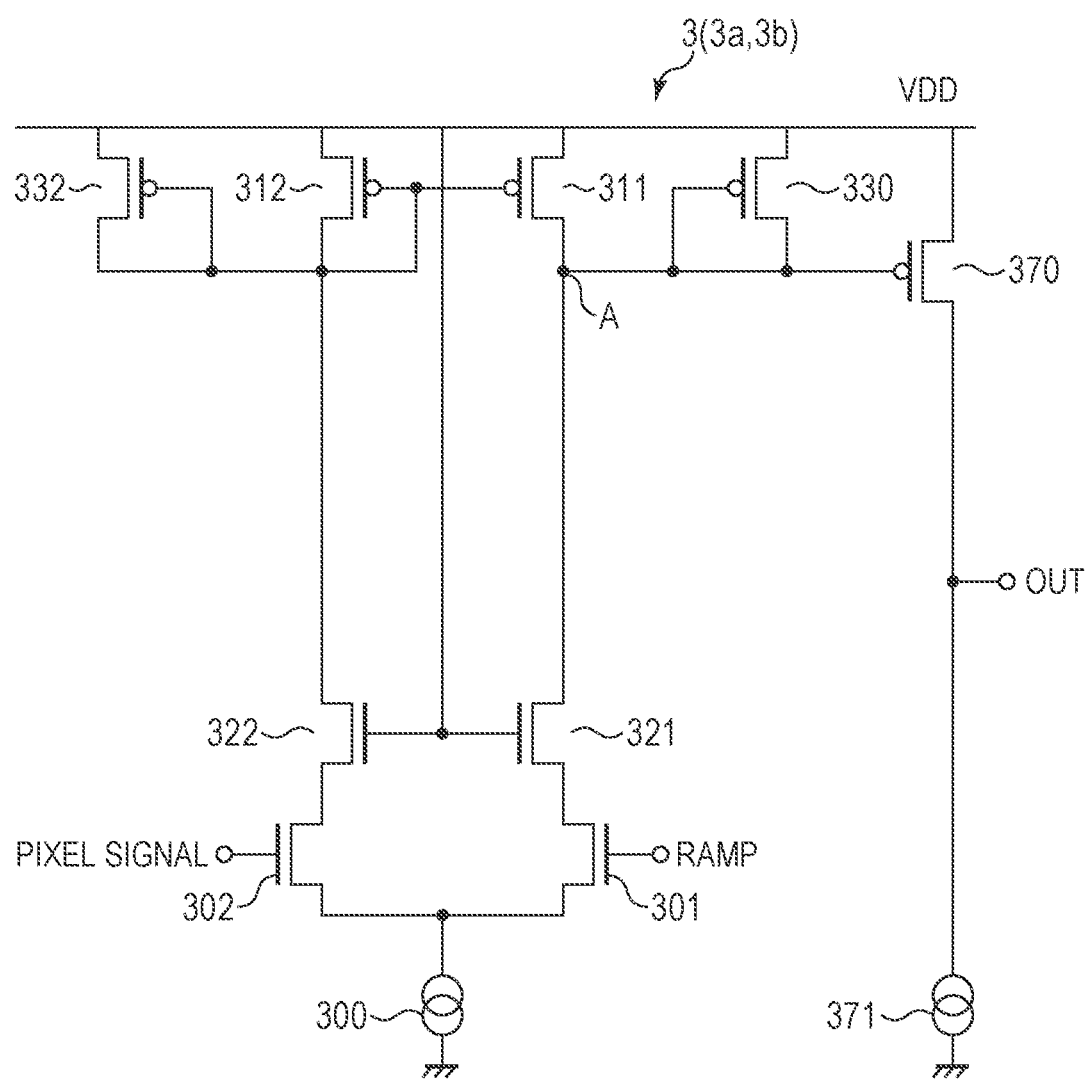
FIG. 7 is an equivalent circuit diagram of a comparator according to a fourth embodiment.

FIG. 7 is a block diagram of a comparator according to the present embodiment. In this embodiment, gates of the cascode transistors 321 and 322 are connected to the power supply VDD in the same manner as the sources of the amplitude limiting transistors 330. When the power supply voltage drops, the potential of the output node A of the differential stage drops by the amplitude limiting transistor 330. The drain potential of the cascode transistor 321 becomes low, and the cascode transistor 321 may be in a linear operation state. In this embodiment, the potential of the gate of the cascode transistor 321 decreases with the power supply voltage, and the gate-source voltage Vgs of the cascode transistor 321 also decreases. Therefore, the drain-source voltage Vds, which satisfies the above formula (1) [Vds>Vth−Vgs], becomes small, and the cascode transistor 321 can maintain a saturation operation state. Therefore, according to the present embodiment, even when the power supply voltage drops, the linear operation of the cascode transistor 321 can be effectively suppressed, and kickback to the input of the comparator 3 can be reduced.

Fifth Embodiment

The comparator is not limited to the above-described embodiment, and may have various configurations. Hereinafter, the present embodiment will be described focusing on the configuration different from the fourth embodiment.

Figure 8:
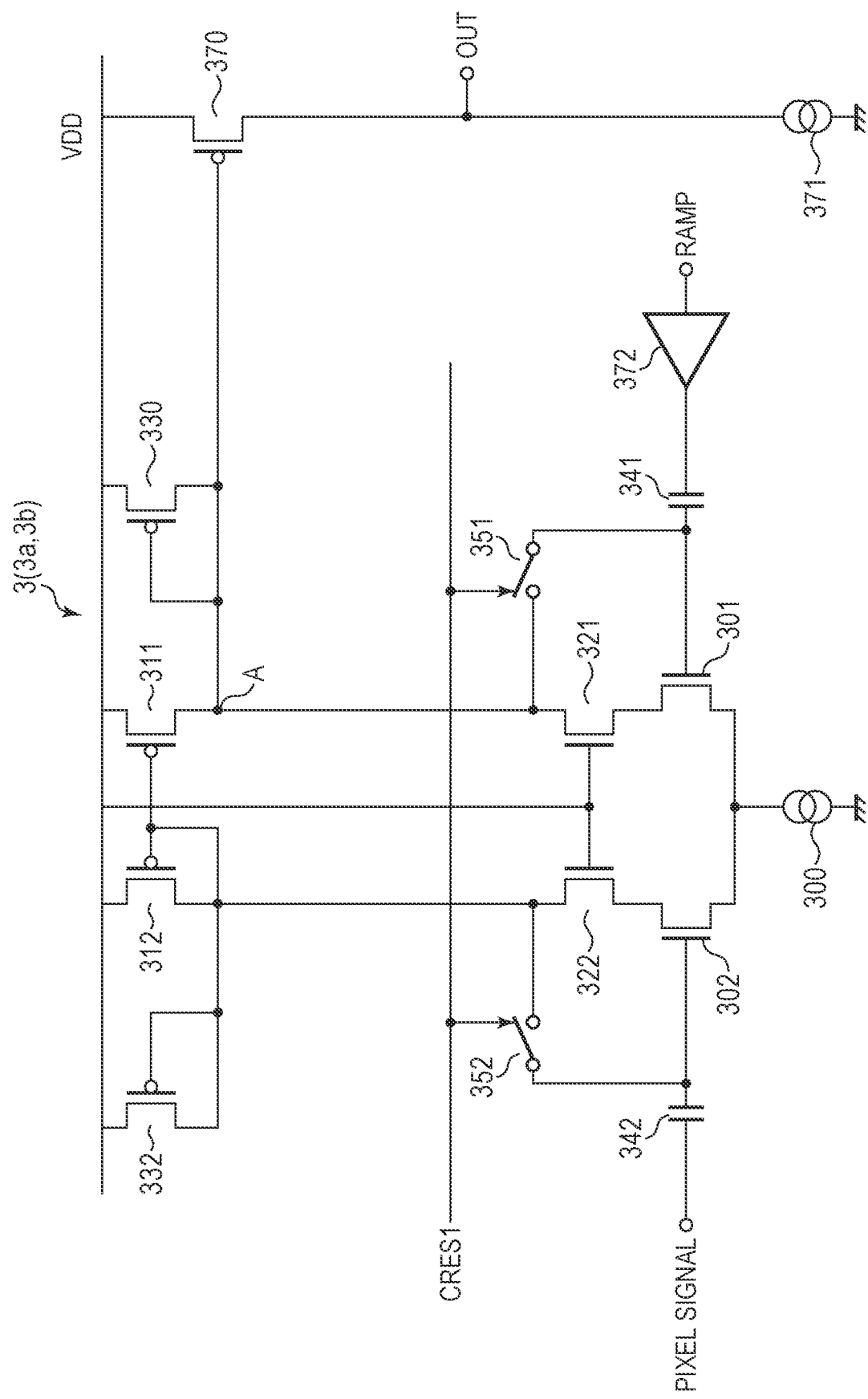
FIG. 8 is an equivalent circuit diagram of a comparator according to a fifth embodiment.

FIG. 8 is an equivalent circuit diagram of a comparator according to the present embodiment. The comparator 3 in FIG. 8 may further include a first capacitor 341, a second capacitor 342 for auto-zero operation, a first switch 351, a second switch 352, and an amplifier 372 for the reference signal RAMP. The amplifier 372 functions as a buffer amplifier for the reference signal RAMP, and can be configured by, for example, a source follower circuit. By providing the amplifier 372, it is possible to prevent the potential variation at the gate of the differential transistor 301 from affecting the other comparators 3. Note that an amplifier may also be provided at the gate of the differential transistor 302.

The capacitors 341 and 342 are connected in series to gates of the differential transistors 301 and 302, respectively. The reference signal RAMP output from the amplifier 372 is input to the gate of the differential transistor 301 via the capacitor 341. The pixel signal is input to the gate of the differential transistor 302 via the capacitor 342. The switch 351 electrically connects or disconnects the gate of the differential transistor 301 and the drain of the load transistor 311, and the switch 352 electrically connects or disconnects the gate of the differential transistor 302 and the drain of the load transistor 312. The switches 351 and 352 are controlled to be turned on or off by the control signal CRES1, and the offset of the potentials of the gates of the differential transistors 301 and 302 can be compensated to realize the auto-zero operation.

Also in this embodiment, it is possible to prevent the cascode transistor 321 from entering a linear operation state, and to reduce kickback to the input node of the comparator 3.

Sixth Embodiment

Figure 9:
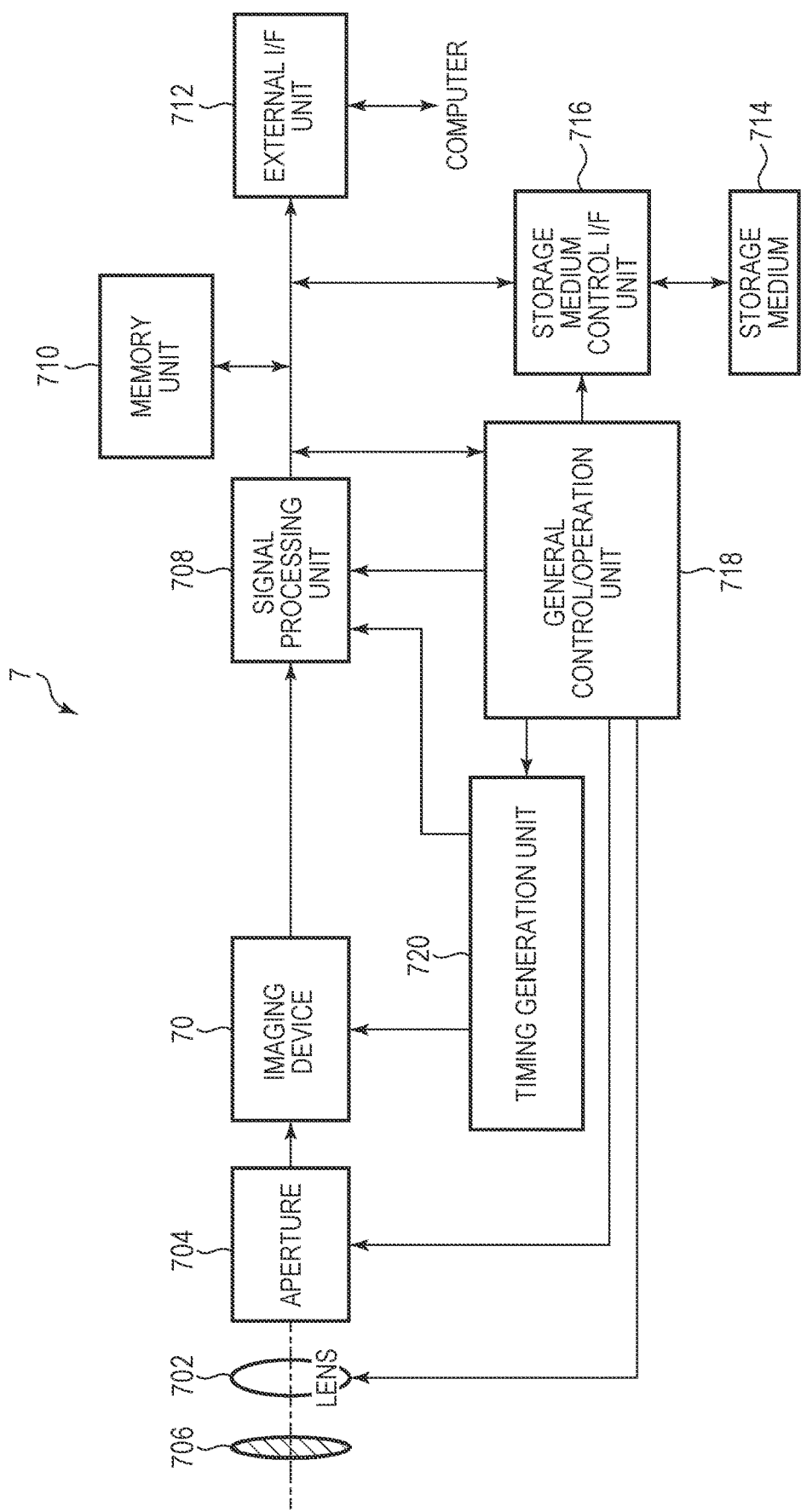
FIG. 9 is a block diagram of an apparatus according to a sixth embodiment.

The solid-state imaging device according to the above-described embodiment is applicable to various apparatus. Examples of an apparatus include a digital still camera, a digital camcorder, a camera head, a copier, a fax machine, a cellular phone, an in-vehicle camera, an observation satellite, and a surveillance camera. FIG. 9 is a block diagram of a digital still camera as an example of an apparatus.

The apparatus 7 shown in FIG. 9 includes a barrier 706, a lens 702, an aperture 704, an imaging device 70 (an example of a photoelectric conversion device), a signal processing unit (processing device) 708, a timing generation unit 720, a general control/operation unit 718 (control device), a memory unit 710 (storage device), a storage medium control I/F unit 716, a storage medium 714, and an external I/F unit 712. At least one of the barrier 706, the lens 702, and the aperture 704 is an optical device corresponding to the device. The bather 706 protects the lens, and the lens 702 forms an optical image of the subject on the imaging device 70. The aperture 704 varies the amount of light passing through the lens 702. The imaging device 70 is configured as in the above-described embodiment, and converts an optical image formed by the lens 702 into image data (image signal). Here, it is assumed that an AD (analog-digital) conversion unit is formed on the semiconductor substrate of the imaging device 70. The signal processing unit 708 compresses various corrections and data on the imaging data output from the imaging device 70. The timing generation unit 720 outputs various timing signals to the imaging device 70 and the signal processing unit 708. The general control/operation unit 718 controls the overall digital still camera, and the memory unit 710 temporarily stores image data. The storage medium control I/F unit 716 is an interface for recording or reading image data in or from the storage medium 714, and the storage medium 714 is a removable recording medium such as a semiconductor memory for recording or reading image data. The external I/F unit 712 is an interface for communicating with an external computer or the like. The timing signal or the like may be input from the outside of the apparatus. Further, the apparatus 7 may include a display device (a monitor, an electronic finder, or the like) for displaying information obtained by the photoelectric conversion device. The apparatus includes at least a photoelectric conversion device. Further, the apparatus includes at least one of an optical device, a control device, a processing device, a display device, a storage device, and machinery equipment that operates based on information obtained by the photoelectric conversion device. The machinery equipment is a movable unit (for example, a robot arm) that operates upon receipt of a signal from the photoelectric conversion device.

In the present embodiment, the imaging device 70 and the AD converter are provided on different semiconductor substrates, but the imaging device 70 and the AD converter may be formed on the same semiconductor substrate. The imaging device 70 and the signal processing unit 708 may be formed on the same semiconductor substrate.

Each pixel may include a first photoelectric conversion unit and a second photoelectric conversion unit. The signal processing unit 708 may be configured to process the pixel signal based on the charge generated in the first photoelectric conversion unit and the pixel signal based on the charge generated in the second photoelectric conversion unit, and acquire the distance information from the imaging device 70 to the object.

Seventh Embodiment

Figure 10A:
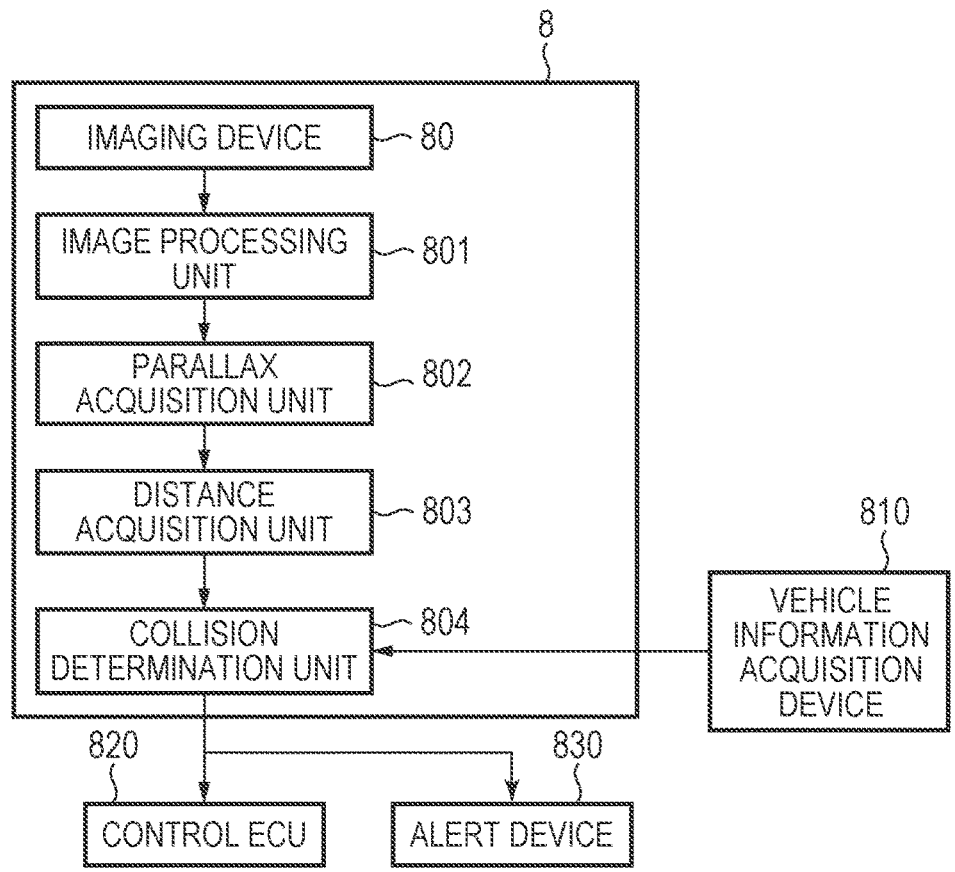
FIG. 10A is a block diagram of an apparatus according to a seventh embodiment.
Figure 10B:
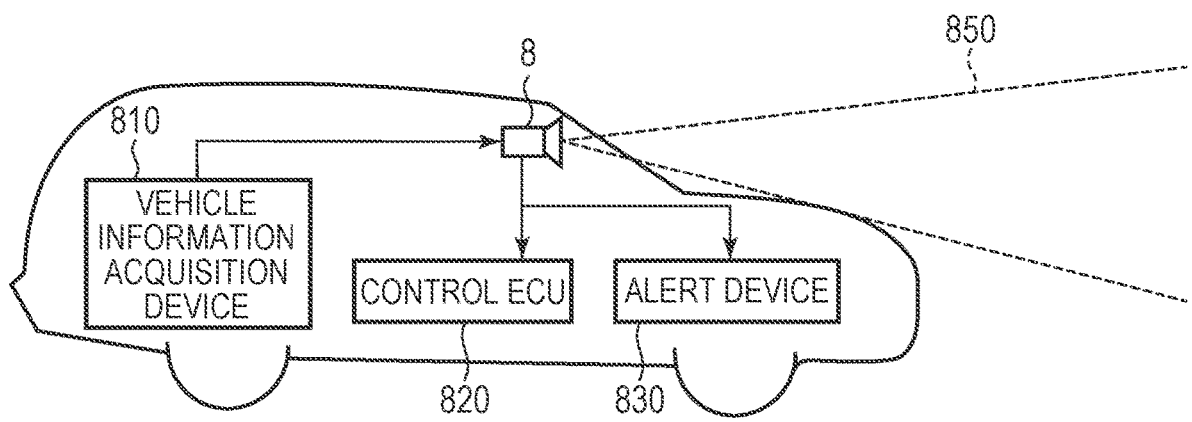
FIG. 10B is a block diagram of the apparatus according to the seventh embodiment.

FIGS. 10A and 10B are block diagrams of an apparatus related to the in-vehicle camera according to the present embodiment. The apparatus 8 includes the imaging device 80 (an example of a photoelectric conversion device) according to the above-described embodiment, and a signal processing device (processing device) that processes a signal from the imaging device 80. The apparatus 8 includes an image processing unit 801 that performs image processing on a plurality of image data acquired by the imaging device 80, and a parallax acquisition unit 802 that calculates parallax (phase difference of parallax images) from the plurality of image data acquired by the apparatus 8. Further, the apparatus 8 includes a distance acquisition unit 803 that calculates a distance to the object based on the calculated parallax, and a collision determination unit 804 that determines whether there is a possibility of collision based on the calculated distance. Here, the parallax acquisition unit 802 and the distance acquisition unit 803 are an example of a distance information acquiring unit that acquires distance information to an object. That is, the distance information is information related to parallax, defocus amount, distance to an object, and the like. The collision determination unit 804 may determine the possibility of collision using any of the distance information. The distance information acquisition means may be realized by a hardware designed exclusively, or may be realized by a software module. It may be realized by FPGA (Field Programmable Gate Array), ASIC (Application Specific Integrated Circuit) or a combination thereof.

The apparatus 8 is connected to the vehicle information acquisition device 810, and can acquire vehicle information such as a vehicle speed, a yaw rate, and a steering angle. A control ECU 820 is connected to the apparatus 8. The ECU 820 is a control device that outputs a control signal for generating braking force to the vehicle based on the determination result of the collision determination unit 804. The apparatus 8 is also connected to an alert device 830 that issues an alert to the driver based on the determination result of the collision determination unit 804. For example, when the possibility of collision is high as the determination result of the collision determination unit 804, the control ECU 820 performs vehicle control for avoiding collision and reducing damage by applying a brake, returning an accelerator, suppressing engine output, or the like. The alert device 830 sounds an alert such as a sound, displays alert information on a screen of a car navigation system or the like, and applies vibration to a seatbelt or a steering wheel, thereby warning the user. The apparatus 8 functions as a control means for controlling the operation of controlling the vehicle as described above.

In the present embodiment, an image of the periphery of the vehicle, for example, the front or the rear is taken by the apparatus 8. FIG. 10B shows a device when capturing an image of the front of the vehicle (image capturing range 850). The vehicle information acquisition device 810 as the imaging control means sends an instruction to the apparatus 8 or the imaging device 80 so as to perform the operations described in the first to seventh embodiments. With such a configuration, the accuracy of distance measurement can be further improved.

Although an example in which the vehicle is controlled so as not to collide with another vehicle has been described above, the present disclosure is also applicable to control in which the vehicle is automatically driven following another vehicle, to control in which the vehicle is automatically driven so as not to protrude from a lane, and the like. Further, the apparatus can be applied not only to a vehicle such as an automobile, but also to a mobile object (mobile device) such as a ship, an aircraft, an artificial satellite, an industrial robot, and a consumer robot. In addition, the present disclosure can be applied not only to a moving object, but also to apparatus using an object recognition or a biological recognition such as an intelligent transportation system (ITS) and a surveillance system.

OTHER EMBODIMENTS

The present disclosure is not limited to the above-described embodiments, and various modifications are possible. For example, an example in which a configuration of a part of any embodiment is added to another embodiment or an example in which a configuration of a part of another embodiment is substituted is also an embodiment of the present disclosure.

Although the pair of cascode transistors 321 and 322 are disposed in the above-described embodiment, only the cascode transistor 321 on the output node A side may be disposed.

Embodiment(s) of the present disclosure can also be realized by a computer of a system or an apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-033250, filed Mar. 3, 2021, which is hereby incorporated by reference herein in its entirety.

What is claimed is:

1. A comparator comprising:
   a first differential transistor and a second differential transistor forming a differential pair;
   a first load transistor and a second load transistor respectively provided to the first differential transistor and the second differential transistor;
   a first cascode transistor connected in cascode between the first differential transistor and the first load transistor; and
   an amplitude limiting element configured to limit an amplitude of an output signal at an output node between the first load transistor and the first cascode transistor,
   wherein the amplitude limiting element is an amplitude limiting transistor, and a gate and a drain of the amplitude limiting transistor are connected to the output node, and
   wherein a gate of the first cascode transistor is connected to a source of the amplitude limiting transistor.

2. The comparator according to claim 1, wherein a signal is input to a gate of the first differential transistor via a buffer amplifier.

3. The comparator according to claim 1, wherein a predetermined bias voltage is applied to a gate of the first cascode transistor.

4. A photoelectric conversion device comprising:
   the comparator according to claim 1;
   a plurality of pixels that are arranged in an array and output pixel signals corresponding to incident light; and
   a reference signal generating circuit that generates a reference signal whose voltage changes depending on time,
   wherein the comparator outputs a signal representing a comparison result between the pixel signal and the reference signal.

5. The comparator according to claim 1, wherein a source of each of the first load transistor, the second load transistor, and the amplitude limiting transistor is connected to a power supply.

6. The comparator according to claim 1, further comprising a second cascode transistor that is connected in cascode between the second differential transistor and the second load transistor.

7. The comparator according to claim 6, wherein, gates of the first cascode transistor and the second cascode transistor are connected to each other.

8. The comparator according to claim 1, further comprising another transistor that is paired with the amplitude limiting transistor,
   wherein a source of the another transistor is connected to a source of each of the first load transistor, the second load transistor, and the amplitude limiting transistor,
   wherein a gate and a drain of the another transistor are connected to a drain of the second load transistor.

9. The comparator according to claim 1,
   wherein the first cascode transistor satisfies the formula (1):

$$Vds > Vgs - Vth \tag{1}$$

where Vds is voltage between the drain and the source, Vgs is voltage between the gate and the source, and Vth is threshold voltage.

10. The comparator according to claim 9, wherein the formula (1) is satisfied from the minimum value to the maximum value of the output signal.

11. The comparator according to claim 9,
    wherein the first cascode transistor satisfies the formula (2):

$$Vds > Vgs - Vth = \sqrt{\frac{2LI}{\mu C_{ox} W}} \tag{2}$$

where L is gate length, I is drain current, μ is mobility, Cox is gate oxide film capacitance per unit area, and W is gate width.

12. The comparator according to claim 11, wherein the gate length L of the first cascode transistor is shorter than the gate length of the first differential transistor.

13. The comparator according to claim 11, wherein the gate width W of the first cascode transistor is larger than the gate width of the first differential transistor.

14. The comparator according to claim 1, further comprising:
    a first capacitor that is connected in series to a gate of the first differential transistor;
    a second capacitor that is connected in series to a gate of the second differential transistor;
    a first switch that electrically connects or disconnects a gate of the first differential transistor and a drain of the first load transistor; and
    a second switch that electrically connects or disconnects a gate of the second differential transistor and a drain of the second load transistor.

15. An apparatus comprising:
    the photoelectric conversion device according to claim 4; and
    at least one of an optical device corresponding to the photoelectric conversion device;
    a control device that controls the photoelectric conversion device;
    a processing device that processes a signal output from the photoelectric conversion device;
    a display device that displays information obtained by the photoelectric conversion device;
    a storage device that stores information obtained by the photoelectric conversion device; and
    a machinery equipment that operates based on information obtained by the photoelectric conversion apparatus.

16. The apparatus according to claim 15,
    wherein the pixel includes a plurality of photoelectric conversion units, and wherein the processing device processes the image signals generated by the plurality of photoelectric conversion units and acquires distance information from the photoelectric conversion device to an object.

17. A comparator comprising:
    a first differential transistor and a second differential transistor forming a differential pair;
    a first load transistor and a second load transistor respectively provided to the first differential transistor and the second differential transistor;
    a first cascode transistor connected in cascode between the first differential transistor and the first load transistor; and
    an amplitude limiting element configured to limit an amplitude of an output signal at an output node between the first load transistor and the first cascode transistor,
    wherein the first cascode transistor satisfies the formula (1):

$$Vds > Vgs - Vth \tag{1}$$

where Vds is voltage between the drain and the source, Vgs is voltage between the gate and the source, and Vth is threshold voltage,
    wherein the first cascode transistor satisfies the formula (2):

$$Vds > Vgs - Vth = \sqrt{\frac{2LI}{\mu C_{ox} W}} \tag{2}$$

where L is gate length, I is drain current, μ is mobility, Cox is gate oxide film capacitance per unit area, and W is gate width, and
    wherein the gate length L of the first cascode transistor is shorter than the gate length of the first differential transistor.

18. The comparator according to claim 17, wherein the amplitude limiting element is an amplitude limiting transistor, and a gate and a drain of the amplitude limiting transistor are connected to the output node.

19. A photoelectric conversion device comprising:
    the comparator according to claim 17;
    a plurality of pixels that are arranged in an array and output pixel signals corresponding to incident light; and
    a reference signal generating circuit that generates a reference signal whose voltage changes depending on time,
    wherein the comparator outputs a signal representing a comparison result between the pixel signal and the reference signal.

20. An apparatus comprising:
    the photoelectric conversion device according to claim 19; and
    at least one of an optical device corresponding to the photoelectric conversion device;
    a control device that controls the photoelectric conversion device;
    a processing device that processes a signal output from the photoelectric conversion device;
    a display device that displays information obtained by the photoelectric conversion device;

a storage device that stores information obtained by the photoelectric conversion device; and a machinery equipment that operates based on information obtained by the photoelectric conversion apparatus.

21. The apparatus according to claim 20, wherein the pixel includes a plurality of photoelectric conversion units, and wherein the processing device processes the image signals generated by the plurality of photoelectric conversion units and acquires distance information from the photoelectric conversion device to an object.

* * * * *